US009508420B1

(12) United States Patent
Hunt-Schroeder et al.

(10) Patent No.: US 9,508,420 B1
(45) Date of Patent: Nov. 29, 2016

(54) VOLTAGE-AWARE ADAPTIVE STATIC RANDOM ACCESS MEMORY (SRAM) WRITE ASSIST CIRCUIT

(71) Applicant: GLOBALFOUNDRIES INC., Grand Cayman (KY)

(72) Inventors: Eric D. Hunt-Schroeder, South Burlington, VT (US); John A. Fifield, Burlington, VT (US); Darren L. Anand, Williston, VT (US); Kevin A. Batson, Williston, VT (US)

(73) Assignee: GLOBALFOUNDRIES INC, Grand Cayman (KY)

( * ) Notice: Subject to any disclaimer, the term of this patent is extended or adjusted under 35 U.S.C. 154(b) by 0 days.

(21) Appl. No.: 15/009,132

(22) Filed: Jan. 28, 2016

(51) Int. Cl.
*G11C 5/14* (2006.01)
*G11C 11/419* (2006.01)

(52) U.S. Cl.
CPC ..................... *G11C 11/419* (2013.01)

(58) Field of Classification Search
CPC .................................................. G11C 11/419
USPC .................... 365/154, 156, 189.09, 189.16
See application file for complete search history.

(56) References Cited

U.S. PATENT DOCUMENTS

| 8,363,453 | B2* | 1/2013 | Arsovski | G11C 7/12 365/154 |
| 8,520,429 | B2 | 8/2013 | Behrends et al. | |
| 8,593,890 | B2* | 11/2013 | Adams | G11C 11/419 365/154 |
| 8,964,490 | B2 | 2/2015 | Chow et al. | |
| 9,070,432 | B2* | 6/2015 | Hsieh | |
| 9,087,607 | B2* | 7/2015 | Adams | G11C 11/419 |
| 9,208,900 | B2* | 12/2015 | Sinangil | G11C 29/52 |
| 9,324,392 | B1* | 4/2016 | Asenov | G11C 7/12 |
| 2009/0147585 | A1* | 6/2009 | Ch'ng | G11C 8/08 365/185.18 |
| 2009/0235171 | A1* | 9/2009 | Adams | G11C 7/1096 715/723 |
| 2010/0188909 | A1* | 7/2010 | Kenkare | G11C 11/419 365/189.16 |
| 2012/0140551 | A1* | 6/2012 | Arsovski | G11C 7/12 365/154 |
| 2012/0163110 | A1* | 6/2012 | Sinha | G11C 7/227 365/203 |
| 2012/0170391 | A1* | 7/2012 | Janardan | G11C 7/04 365/194 |
| 2013/0286717 | A1* | 10/2013 | Adams | G11C 11/419 365/154 |
| 2014/0112062 | A1* | 4/2014 | Trivedi | G11C 11/419 365/154 |
| 2014/0160871 | A1* | 6/2014 | Zimmer | G11C 11/419 365/189.16 |
| 2015/0131364 | A1* | 5/2015 | Hsieh | G11C 11/419 365/154 |
| 2015/0146479 | A1* | 5/2015 | Pilo | G11C 11/419 365/156 |
| 2015/0279454 | A1* | 10/2015 | Sano | G11C 7/12 365/189.09 |

* cited by examiner

*Primary Examiner* — Viet Q Nguyen
(74) *Attorney, Agent, or Firm* — Anthony Canale; Andrew M. Calderon; Roberts, Mlotkowski, Safran, Cole & Calderon, P.C.

(57) ABSTRACT

Approaches for a write assist circuit are provided. The write assist circuit includes a plurality of binary weighted boost capacitors which each contain a first node coupled to a bitline and a second node connected to a corresponding boost enabling transistor, and a plurality of boost enabling transistors which each contain a gate connected to a boost control enable signal for controlling a corresponding binary weighted boost capacitor. The boost control enable signal of each of the plurality of boost enabling transistors is controlled by encoded values based on a power supply level.

15 Claims, 5 Drawing Sheets

| VCS | Flag | Boost Default | 1 Less Boost | 1 More Boost | 2 Less Boost | Boost Hi V+ | Boost Lo V+ | Boost Hi V++ | Boost Lo V++ |
|---|---|---|---|---|---|---|---|---|---|
| <750 | none | 7 | 6 | 7 | 5 | 7 | 7 | 7 | 7 |
| 750 | F<0> | 6 | 5 | 7 | 4 | 6 | 7 | 6 | 7 |
| 775 | F<1> | 5 | 4 | 6 | 3 | 5 | 6 | 5 | 7 |
| 800 | F<2> | 5 | 4 | 6 | 3 | 5 | 6 | 5 | 7 |
| 825 | F<3> | 4 | 3 | 5 | 2 | 4 | 5 | 4 | 6 |
| 850 | F<4> | 4 | 3 | 5 | 2 | 4 | 4 | 4 | 4 |
| 875 | F<5> | 3 | 2 | 4 | 1 | 4 | 3 | 4 | 3 |
| 900 | F<6> | 2 | 1 | 3 | 0 | 3 | 2 | 4 | 2 |
| 950 | F<7> | 1 | 0 | 2 | 0 | 2 | 1 | 3 | 1 |
| EMAVM_WA<3:0> | | 0 | 1 | 2 | 3 | 4 | 5 | 6 | 7 |

FIG. 4

VOLTAGE-AWARE ADAPTIVE STATIC RANDOM ACCESS MEMORY (SRAM) WRITE ASSIST CIRCUIT

FIELD OF THE INVENTION

The present disclosure relates to a static random access memory (SRAM) write assist circuit, and more particularly, to a SRAM write assist circuit that is adaptive to voltage variations and independent of process and temperature variations and methods thereof.

BACKGROUND

Memory devices are commonly employed as internal storage areas in a computing device or other electronic equipment. One specific type of memory used to store data in a computing device is random access memory (RAM). RAM is typically used as main memory in a computing environment, and is generally volatile in that once power is turned off, all data stored in the RAM is lost.

A static RAM (SRAM) is one example of RAM. SRAM has the advantage of holding data without a need for refreshing. A typical SRAM device includes an array of individual SRAM cells. Each SRAM cell is capable of storing a binary voltage value that represents a logical data bit (e.g., "0" or "1"). One existing configuration for an SRAM cell includes a pair of cross-coupled devices such as inverters. The inverters act as a latch that stores the data bit therein, so long as power is supplied to the memory array. In a conventional six-transistor (6T) cell, a pair of access transistors or pass gates (when activated by a word line) selectively couples the inverters to a pair of complementary bitlines (i.e., a bitline true and bitline complementary). Other SRAM call designs may include a different number of transistors (e.g., 4T, 8T, etc.).

The design of SRAM cells has traditionally involved a compromise between the read and write functions of the memory array to maintain cell stability, read performance and write performance. In particular, the transistors which make up the cross-coupled latch must be weak enough to be over-driven during a write operation, while also strong enough to maintain their data value when driving a bitline during a read operation. The access transistors that connect the cross-coupled inverters to the true and complement bitlines affect both the stability and performance of the cell.

In one-port SRAM cells, a single pair of access transistors are conventionally used for both read and write access to the cell. The gates are driven to a digital value in order to switch the transistors between an "on" and "off" state. The optimization of an access for a write operation would drive the reduction of the on-resistance ($R_{on}$) for the device. On the other hand, the optimization of an access transistor for a read operation drives an increase in $R_{on}$ in order to isolate the cell from the bitline capacitance and prevents a cell disturbance.

This compromise between the read function and the write function for an SRAM becomes more of an issue as integrated circuits are scaled down in size. In particular, read and write margins of the SRAM cells, which measure how reliably the bits of the SRAM cells can be read from and written into, are reduced as the operation voltages of the integrated circuits are reduced with the down-scaling of the circuits. Reduced read and write margins may consequently cause errors in the respective read and write operations for the SRAM cells. Further, the transistors which make up the cross-coupled latch must be weak enough to be over-driven during a write operation, while also strong enough to maintain their data value while driving a bitline during a read operation.

SUMMARY

In a first aspect of the disclosure, there is a write assist circuit which includes a plurality of binary weighted boost capacitors which each contain a first node coupled to a bitline and a second node connected to a corresponding boost enabling transistor, and a plurality of boost enabling transistors which each contain a gate connected to a boost control enable signal for controlling a corresponding binary weighted boost capacitor. In the write assist circuit, the boost control enable signal of each of the plurality of boost enabling transistors is controlled by encoded values based on a power supply level.

In another aspect of the disclosure, there is a write assist circuit which includes a plurality of NFET boost transistors which each contain a source and a drain coupled to a bitline and a gate connected to a corresponding boost enabling transistor, and a plurality of boost enabling NFET transistors which each contain a gate connected to a boost control enable signal for controlling a corresponding NFET boost transistor. In the write assist circuit, the boost control enable signal of each of the plurality of boost enabling NFET transistors is controlled by encoded values based on a power supply level.

In another aspect of the disclosure, there is a method which includes charging at least one binary weighted boost capacitor of a plurality of binary weighted boost capacitors based on encoded values, and discharging the at least one binary weighted boost capacitor to provide a boost voltage at a level less than a ground signal. In the method, the encoded values are based on a power supply level and determine the boost voltage.

BRIEF DESCRIPTION OF THE DRAWINGS

The present disclosure is described in the detailed description which follows, in reference to the noted plurality of drawings by way of non-limiting examples of exemplary embodiments of the present disclosure.

FIG. 4 shows a table of write boost control options of a write assist circuit in accordance with aspects of the disclosure.

DETAILED DESCRIPTION

Figure 1:
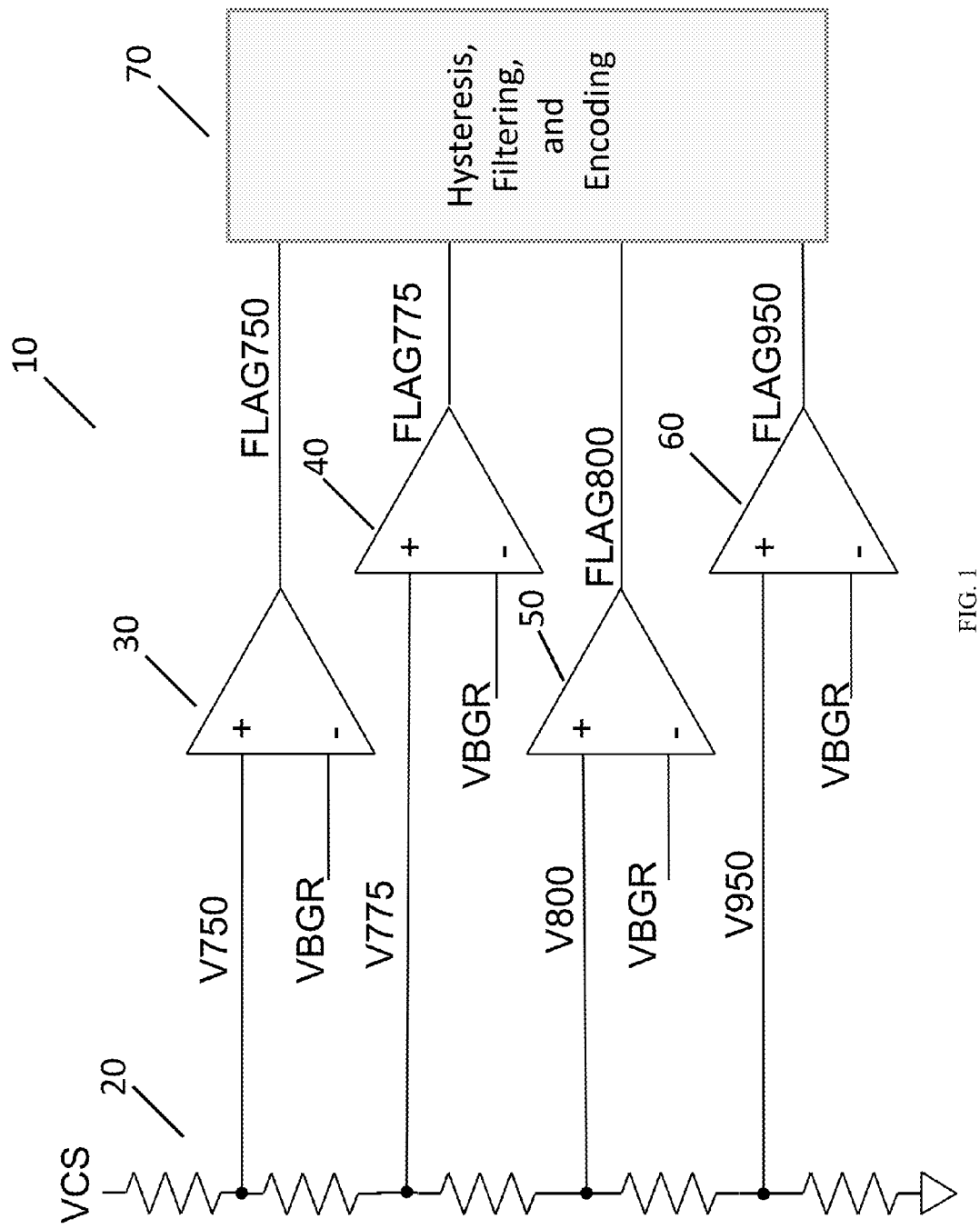
FIG. 1 shows a schematic view of a bandgap voltage reference circuit in accordance with aspects of the disclosure.

The present disclosure relates to a static random access memory (SRAM) write assist circuit, and more particularly, to a SRAM write assist circuit that is adaptive to voltage variations and independent of process and temperature variations and methods thereof. In particular, the disclosure introduces a bandgap voltage reference circuit, which is integrated into an electronic chip identification (ECID) so that direct current (DC) flag signals can be provided as the system exceeds various voltage thresholds. The disclosure also presents a SRAM write assist circuit to decode the DC flag signals and either charge or discharge binary weighted capacitors (e.g., three binary weighted capacitors will provide a selected boost of 0×, 1×, 2×, 3×, 4×, 5×, 6×, and 7×). Further, the SRAM write assist circuit will be independent of process and temperature variations. Therefore, the SRAM write assist circuit is transparent to an end user or customer, and can provide no boost (write assist disabled—0×) or variable boost (e.g., 1×, 2×, 3×, 4×, 5×, 6×, or 7×), and is adaptive to voltage variations in a customer supply voltage.

A circuit may provide a single boost from a single capacitor. In such a system, the single boost of the circuit is dependent on relative timings of two write selection signals WSEL<1> and WSEL<0>. This single boost of the circuit brings a bitline below ground (i.e., negative boost level) based on an amount of charge stored on a single capacitor which then decays to ground. However, this approach is problematic because stress issues may occur and managing negative boost levels is very difficult. Further, such an approach may require greater circuit complexity and consume more power due to the boost rising rapidly as the supply voltage increases.

Once a boost level decays to approximately 80% of the peak magnitude, there is little write assist provided at low voltages where significant boost is still required to write the SRAM bit cell. Although this boost technique may work well in older technologies (e.g., 32 nm technology), in newer technologies (e.g., 14 nm technology and beyond), an increased variability requires careful attention and managing of boost at high VCS (e.g., >800 mV) for reliability.

In embodiments, a SRAM write assist circuit provides a boost which corresponds to the supply voltage, does not vary across process and temperature, and is transparent to the end user/customer. Further, in embodiments, the SRAM write assist circuit will require less power than other write assist circuits because the boost provided depends on the supply voltage. The SRAM write assist circuit can also provide a required boost across different supply voltages without affecting reliability of the circuit.

In embodiments, a negative bitline boost system for a SRAM array includes a plurality of binary weighted boost capacitors each selected by a digital control. The digital control may be derived from a control system which measures a power supply level. The control system may include a bandgap reference circuit which outputs a fixed voltage reference, and a plurality of comparators which compare fractions of a power-supply level to the fixed voltage reference to digitally encode the power-supply. Further, the digitally encoded power-supply and a programming profile are input to a control logic to select at least one of the binary weighted boost capacitors to adjust a boost level for the SRAM array.

In embodiments, a negative bitline boost system for a SRAM array includes a plurality of binary weighted boost capacitors each selected by a digital control. The digital control may be derived from a control system which measures a power supply level. The control system may include a bandgap references circuit which outputs a fixed voltage reference, and a plurality of comparators which compare fractions of a power-supply level to the fixed voltage reference to digitally encode the power-supply. The digitally encoded power-supply and a programming profile are input to the control logic to select certain of the binary weighted boost capacitors to adjust a boost level for an SRAM array. Further, the binary weighted boost capacitors are electrically isolated (i.e., floating) when not selected to reduce charge sharing which reduces the boost magnitude.

FIG. 1 shows a schematic view of a bandgap voltage reference circuit in accordance with aspects of the disclosure. By way of an example, the bandgap voltage reference circuit 10 of FIG. 1 may include a resistor ladder 20, a comparator 30, a comparator 40, a comparator 50, a comparator 60, and a hysteresis, filtering, and encoding block 70. In an example, a voltage supply VCS may be supplied through the resistor ladder 20 and a 500 mV bandgap voltage reference VBGR may be supplied to each of the comparators 30, 40, 50, 60.

As further shown in FIG. 1, when VCS exceeds 750 mV, a FLAG750 will be set after a comparison is done through the comparator 30. Further, when VCS exceeds 775 mV, a FLAG775 will be set after a comparison is done through the comparator 40. When VCS exceeds 800 mV, a FLAG800 will be set after a comparison is done through the comparator 50. When VCS exceeds 950 mV, a FLAG950 will be set after a comparison is done through the comparator 60. After the flags are set (i.e., FLAG750, FLAG775, FLAG800, and FLAG950), the flags are passed to the hysteresis, filtering, and encoding block 70.

At the hysteresis, filtering, and encoding block 70 in FIG. 1, the flags are stored for hysteresis, filtering, and encoding. The flags are gray encoded to digital bits and then routed to the SRAM write assist circuit. In embodiments, the hysteresis and filtering can be done before encoding is performed. Further, in embodiments, the encoding can be an 8:3 encoder, such that there are three encoded digital bits routed to the SRAM write assist circuit. Thus, the three encoded digital bits are based on the voltage supply VCS. It should be noted that any number of voltage flags and comparators can be used to provide different voltage steps at different voltage step sizes. Further, a number of digital bits routed to the SRAM write assist circuit can be any whole number, and it is not limited to only three encoded digital bits.

Figure 2:
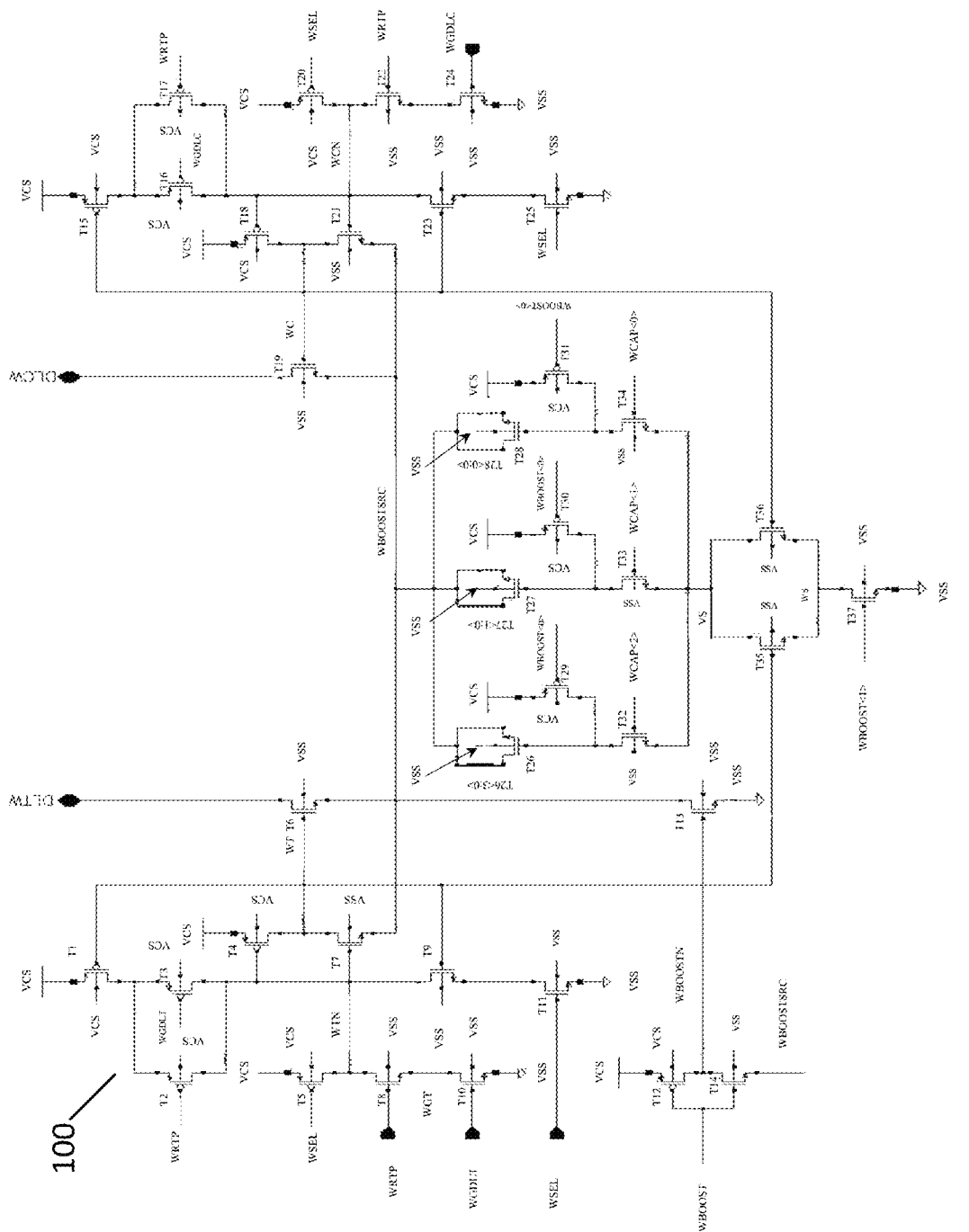
FIG. 2 shows a schematic view of a write assist circuit in accordance with aspects of the disclosure.

FIG. 2 shows a schematic view of a write assist circuit in accordance with aspects of the invention. By way of an example, the write assist circuit 100 of FIG. 2 may be an SRAM write assist circuit. In particular, the write assist circuit 100 shows a plurality of transistors T1-T37 in addition to signal lines. The signal lines include: a true data line write signal DLTW, a true data line complement write signal DLCW, a write selection signal WSEL, a write control signal WRTP, a boost source signal WBOOSTSRC, a boost signal WBOOST, a negative boost signal WBOOSTN, a true write line signal WGDLT, a true write line complement signal WGDLC, a first voltage signal VCS, a second voltage signal VSS, a first control signal WT, a negative first control signal WTN, a second control signal WGT, a third control signal WC, a negative third control signal WCN, a two bit boost signal WBOOST<1:0> (which includes WBOOST<0> and WBOOST<1>), and a three bit capacitance control signal WCAP<2:0> (which includes WCAP<2>, WCAP<1>, and WCAP<0>. The second voltage signal VSS is a voltage level which is below the first voltage signal VCS. In addition, the write assist circuit of FIG. 1 includes a plurality of PFET transistors (e.g., T1, T2, T3, T4, T5, T12, T15, T16, T17, T18, T20, T29, T30, and T31) and a plurality of NFET transistors (e.g., T6, T7, T8, T9, T10, T11, T13, T14, T19, T21, T22, T23, T24, T25, T26, T27, T28, T32, T33, T34, T35, T36, and T37).

As shown in FIG. 2, transistor T1 has a gate connected to a gate of transistor T35, a source connected to the first voltage signal VCS, and a drain connected to a source of transistor T3 and source of transistor T2. The transistor T2 has a gate connected to the write control signal WRTP, a source connected to the drain of the transistor T1, and a drain connected to a drain of a transistor T3. The transistor T3 has a gate connected to the true write line signal WGDLT. The transistor T4 has a gate connected to the drain of the transistor T3, a source connected to the first voltage signal VCS, and a drain connected to a gate of a transistor T6. The transistor T5 has a gate connected to the write selection signal WSEL, a source connected to the first voltage signal VCS, and the drain connected to a gate of a transistor T7. The transistor T6 has a gate connected to the first control signal WT, a drain connected to the true data line write signal DLTW, and a source connected to a drain of transistor T13. The transistor T7 has a gate connected to the negative first control signal WTN, a drain connected to the gate of the transistor T6, and a source connected to the boost signal WBOOSTSRC.

As further shown in FIG. 2, transistor T8 has a gate connected to the write control signal WRTP, a drain connected to the gate of the transistor T7, and a source connected to the second control signal WGT. The transistor T9 has a drain connected to the gate of the transistor T7, a gate connected to the gate of transistor T1, and a source connected to a drain of a transistor T11. The transistor T10 has a gate connected to the true write line signal WGDLT, a drain connected to the second control signal WGT, and a source connected to the second voltage signal VSS. The transistor T11 has a gate connected to the write selection signal WSEL and a source connected to the second voltage signal VSS and a drain connected to the source of transistor T9. The transistor T12 has a gate connected to the boost signal WBOOST, a source connected to the first voltage signal VCS, and a drain connected to a drain of a transistor T14. The transistor T13 has a gate connected to the negative boost signal WBOOSTN and a source connected to the second voltage signal VSS. The transistor T14 has a gate connected to the boost signal WBOOST and a source connected to the boost source signal WBOOSTSRC and a drain connected to signal WBOOSTN.

As further shown in FIG. 2, the transistor T15 has a gate connected to the third control signal WC, a source connected to first voltage signal VCS, and a drain connected to a source of a transistor T16. The transistor T16 has a gate connected to the true write line complement signal WGDLC and a drain connected to a gate of a transistor T18. The transistor T17 has a source connected to the drain of the transistor T15, a gate connected to the write control signal WRTP, and a drain connected to the gate of the transistor T18. The transistor T18 has a source connected to the first voltage signal VCS and a drain connected to a gate of a transistor T19. The transistor T19 has a drain connected to the true data line complement write signal DLCW and a source connected to the boost source signal WBOOSTSRC. The transistor T20 has a gate connected to the write selection signal WSEL, a source connected to the first voltage signal VCS, and a drain connected to the negative third control signal WCN.

As further shown in FIG. 2, transistor T21 has a gate connected to the negative third control signal WCN, a drain connected to the drain of the transistor T18, and a source connected to the boost source signal WBOOSTSRC. The transistor T22 has a gate connected to the write control signal WRTP, a drain connected to the drain of the transistor T20, and a source connected to a drain of transistor T24. The transistor T23 has a gate connected to the third control signal WC, a drain connected to the gate of the transistor T21, and a source connected to a drain of transistor T25. The transistor T24 has a gate connected to the true write line complement signal WGDLC and a source connected to the second voltage signal VSS. The transistor T25 has a gate connected to the write selection signal WSEL and a source connected to the second voltage signal VSS.

As further shown in FIG. 2, in the write assist circuit 100, the transistor T26 has a gate connected to a drain of transistor T32 and both a drain and a source are connected to the boost source signal WBOOSTSRC. The transistor T27 has a gate connected to a drain of transistor T33 and both a drain and a source are connected to the boost source signal WBOOSTSRC. The transistor T28 has a gate connected to a drain of transistor T34 and both a drain and a source are connected to the boost source signal WBOOSTSRC. In FIG. 2, T26<3:0> represents a vector representation of four binary weighted transistors, T27<1:0> represents a vector representation of two binary weighted transistors, and T28<0:0> represents a vector representation of a single transistor.

As further shown in FIG. 2, the transistor T29 has a source connected to the first voltage signal VCS, a gate connected to the WBOOST<0>, and a drain connected to the drain of the transistor T32. The transistor T30 has a source connected to the first voltage signal VCS, a gate connected to the WBOOST<0>, and a drain connected to the drain of the transistor T33. The transistor T31 has a source connected to the first voltage signal VCS, a gate connected to the WBOOST<0>, and a drain connected to the drain of the transistor T34. The transistor T32 has a gate connected to the WCAP<2> and a source connected to a voltage node VS. The transistor T33 has a gate connected to the WCAP<1> and a source connected to the voltage node VS. The transistor T34 has a gate connected to the WCAP<0> and a source connected to the voltage node VS. The transistor T35 has a gate connected to the gate of the transistor T9, a drain connected to the voltage node VS, and a source connected to a voltage node WS. The transistor T36 has a gate connected the gate of the transistor T23, a drain connected to the voltage node VS, and source connected to the voltage node WS. Lastly, the transistor T37 has a gate connected the WBOOST<1>, a drain connected to the voltage node WS, and a source connected to the second voltage signal VSS.

In the write assist circuit 100 of FIG. 2, transistors T26, T27, and T28 act as binary weighted boost capacitors, each containing a first node coupled to a bitline (i.e., WBOOSTSRC) and a second node connected to a corresponding boost enabling transistor. In the write assist circuit 100, transistors T32, T33, and T34 act as boost enabling transistors, each containing a gate connected to a boost control enable signal (i.e., WCAP<2>, WCAP<1>, WCAP<O>). Each of the boost control enable signals are controlled by the three encoded digital bits output from the hysteresis, filtering, and encoding block 70 in FIG. 1. Also, each of the transistors T26, T27, and T28 acting as binary weighted boost capacitors are electrically isolated (i.e., floating) when not selected from the selected binary weighted boost capacitors. Non-selected binary weighted boost capacitors which are electrically isolated from the selected binary weighted boost capacitors in the write assist circuit 100 reduces charge sharing. Charge sharing may reduce the effective boost magnitude, requiring a larger boost capacitor to achieve the same boost magnitude. As noted above, T26<3:0> represents a vector representation of four binary weighted boost capacitors (i.e., for 4× capacitance), T27<1:0> represents a vector representation of two binary weighted boost capacitors (i.e., for 2× capacitance), and T28<0:0> represents a vector representation of a single transistor (i.e. for 1× capacitance).

Moreover, in the write assist circuit 100 of FIG. 2, at least one binary weighted boost capacitor may be charged based on the three encoded digital bits output from the hysteresis, filtering, and encoding block 70 in FIG. 1. Further, the at least one binary weighted boost capacitor may be discharged in the write assist circuit 100 in order to provide a boost voltage level less than a ground signal. The encoded values are based on a power supply level and determine the boost voltage.

In FIG. 2, the write assist circuit 100 is one per sense amp (i.e., one write assist circuit 100 per four bitlines). WBOOST<0> will initially be 0, which enables a path to ground for the boost source signal WBOOSTSRC. When boost is requested, WBOOST<0> will transition from 0 to 1, which will stop charging transistors T26, T27, and T28. Based on the decode in a control circuitry, the signals WCAP<2>, WCAP<1>, and WCAP<0> will be either a logic "1" or logic "0", which will turn on or off the transistors T32, T33, and T34. For example, if the transistor T32 is ON (i.e., WCAP<2> is logic "1"), a 4× capacitance will be provided as boost to bring the bitline below ground after WBOOST<0> transitions from 0 to 1. Therefore, the write assist circuit 100 is essentially temperature and process independent (e.g., can be used in 14 nm technology which exhibits significant variation in transistor threshold voltages). Further, power savings stem from the reduction of boost magnitude as VCS is increased by varying the effective capacitance that will be discharged (e.g., 0×, 1×, 2×, 3×, 4×, 5×, 6×, and 7×). In the embodiments, power savings also occurs by not discharging the boost capacitor to attenuate the boost using two relative timing signals, which is highly dependent on process, voltage, and temperature (PVT).

In FIG. 2, during a write cycle, the write control signal WRTP and the write selection signal WSEL transition from 0 to 1, WBOOST<O> is 0 and WBOOST<1> is 0. Then, either a logic "1" or a logic "0" can be written to the SRAM bitcell depending on whether the true write line signal WGDLT or the true write line complement signal WGDLC fire. If the true write line signal WGDLT is 0 and the true write line complement signal WGDLC is 0, transistors T35 and T36 will stay off, and the boost capacitors (i.e., transistors T26, T27, and T28) will not discharge (i.e., transistors T26, T27, and T28 will perform bit masking).

Still referring to FIG. 2, when the true write line signal WGDLT or the true write line complement signal WGDLC transitions from 0 to 1, the true data line write signal DLTW or the true data line complement write signal DLCW will be pulled to the second voltage signal VSS. For write assist to occur, WBOOST<0> will transition from 0 to 1, which makes WBOOSTN equal to 0, turns off transistor T13, and connects the boost source signal WBOOSTSRC and the true data line write signal DLTW or the true data line complement write signal DLCW to the second voltage signal VSS. As a result, transistors T29, T30, and T31 are turned off, and the boost capacitors (i.e., transistors T26, T27, and T28) are charged up. Then, WBOOST<1> will transition from 0 to 1, which turns on transistor T37 and the charge stored in the boost capacitors (i.e., transistors T26, T27, and T28) will pull the net boost source signal WBOOSTSRC and the true data line write signal DLTW or the true data line complement write signal DLCW below the second voltage signal VSS, providing write assist to the SRAM bit cell.

In an alternative embodiment of FIG. 2, the binary weighted boost capacitors (i.e., transistors T26, T27, and T28) may be PMOS transistors which have their gate tied to WBOOSTSRC. Further, in the alternative embodiment, each of the transistors T26, T27, and T28 may have their source and drain connected to the drain of T29, T30, and T31, respectively. This alternative embodiment represents a flipped version of the NMOS binary weighted boost capacitors in FIG. 2.

Figure 3:
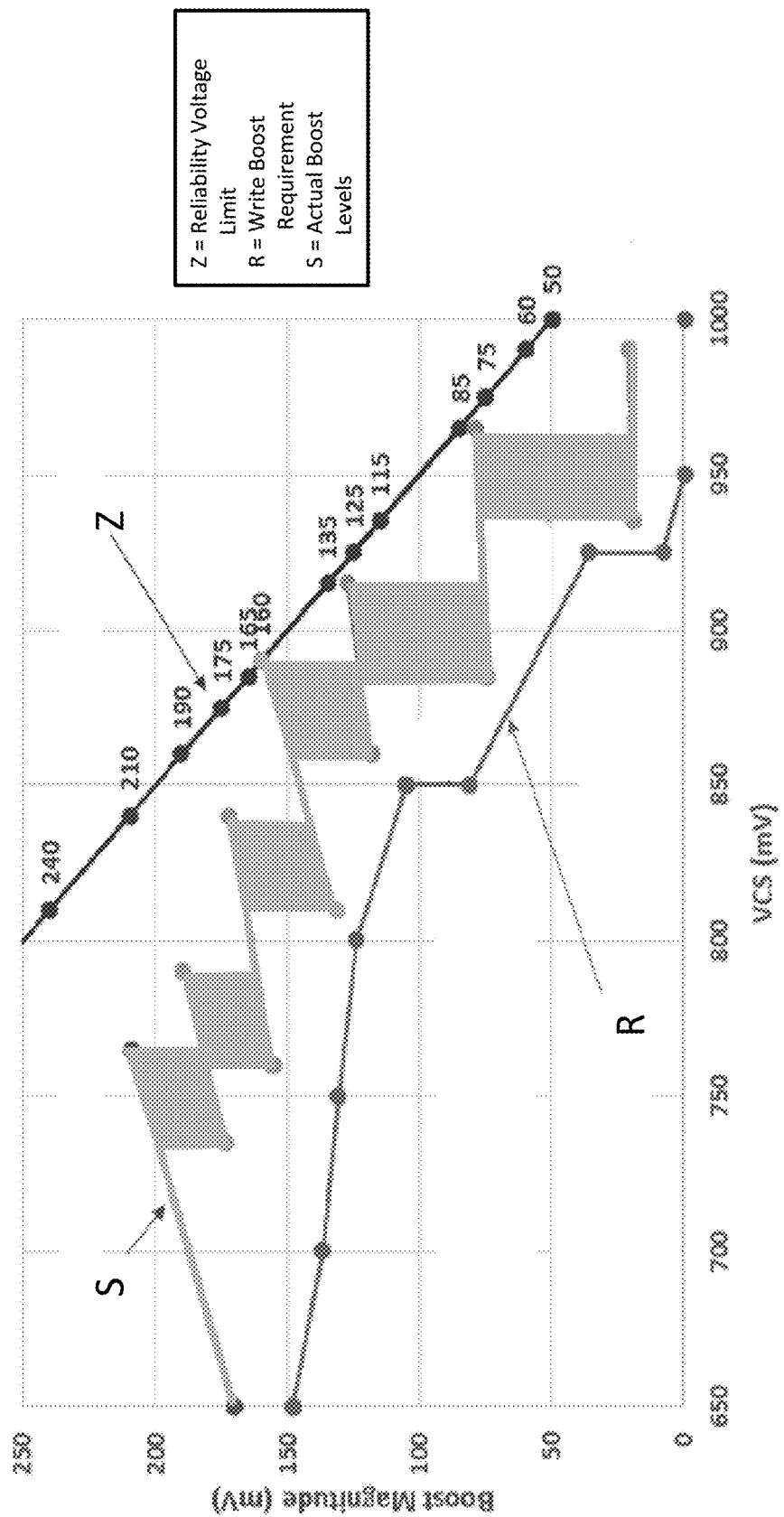
FIG. 3 shows a graph of the characteristics of a write assist circuit with binary weighted capacitors in accordance with aspects of the disclosure.

FIG. 3 shows a graph of the characteristics of a write assist circuit with binary weighted capacitors in accordance with aspects of the disclosure. In FIG. 3, the y-axis represents a boost magnitude in millivolts (mV) and the x-axis represents a supply voltage VCS level in millivolts (mV). In FIG. 3, the reliability voltage limit graph (i.e., downward sloping graph labeled "Z") shows the limit of reliability for the SRAM write assist circuit at different supply voltages VCS. For example, at 1000 mV for VCS, the highest boost magnitude that can be provided reliably is 50 mV of boost. Further, at 800 mV for VCS, the highest boost magnitude that can be provided reliably is 250 mV of boost.

Moreover, in FIG. 3, the write boost requirement graph (i.e., downward sloping graph labeled "R") shows the boost requirements in order to provide a write assist in a cell. Therefore, these values on the boost requirement graph are the minimum boost required to allow for a write assist. For example, at 800 mV for VCS, the minimum boost required to allow for a write assist is approximately 125 mV of boost. Further, at 650 mV for VCS, the minimum boost required to allow for a write assist is approximately 150 mV of boost.

In FIG. 3, the actual boost levels graph (i.e., downward sloping graph with rectangular shapes and labeled "S") show a typical boost that occurs in the write assist circuit of the embodiments with binary weighted capacitors. As shown in FIG. 3, the actual boost levels will vary at different VCS voltages depending on process and temperature. For example, at 950 mV for VCS, the actual boost levels will range from approximately 25 mV to 125 mV of boost depending on process and temperature. However, even at 950 mV for VCS, the actual boost levels are between the write boost requirement and the reliability voltage limits. Therefore, the write assist circuit of the embodiments will work in a reliable fashion (i.e., below the reliability voltage limit graph) with a boost that is far greater than a minimum write boost requirement. As shown in FIG. 3, the actual boost levels from 650 mV to 1000 mV for VCS are always in the operation range between the reliability voltage limit and the minimum write boost requirement.

FIG. 4 shows a table of write boost control options of a write assist circuit in accordance with aspects of the disclosure. In embodiments, a boost shape will have up to eight pre-set options. The eight boost steps can be defined across the entire VCS voltage range of the power supply. The boost level may be coded in three bits with eight levels of boost. Thus, for eight boost steps across three bits, there is 24 bits of data (e.g., 8 boost steps×3 bits). Further, there are eight shape options, which can produce up to 192 bits (e.g., 24 bits per shape×8 shape options). In the embodiments, the 192 bits may be implemented in a simple CMOS ROM code for easy programming of the boost levels in the design. Therefore, the write boost control options in FIG. 4 increases flexibility for allowing more boost options (i.e., gives additional boost across the entire VCS voltage range of the power supply). In particular, the write boost control options can provide flexibility in order to reshape the boost segments in FIG. 3. The 8 shape options of FIG. 4 are one of many possible shape options based on the design requirements. In FIG. 4, 1 less boost represents an effective capacitance reduction of one as compared to the default. In FIG. 4, 1 more boost represents an effective capacitance increase of one as compared to the default. In FIG. 4, 2 less boost represents an effective capacitance reduction of two as compared to the default. In FIG. 4, 2 more boost represents an effective capacitance increase of two as compared to the default. In FIG. 4, Lo V+ represents an effective capacitance increase for low supply voltage VCS below 825 mV. In FIG. 4, Boost Hi V+ represents an increase in effective capacitance for high supply voltage VCS above 875 mV. In FIG. 4, Boost Hi V++ represents an increase of two in effective capacitance for high supply voltage VCS above 875 mV. In FIG. 4, Boost Lo V++ represents an increase of two in effective capacitance for low supply voltage VCS below 825 mV.

Figure 5:
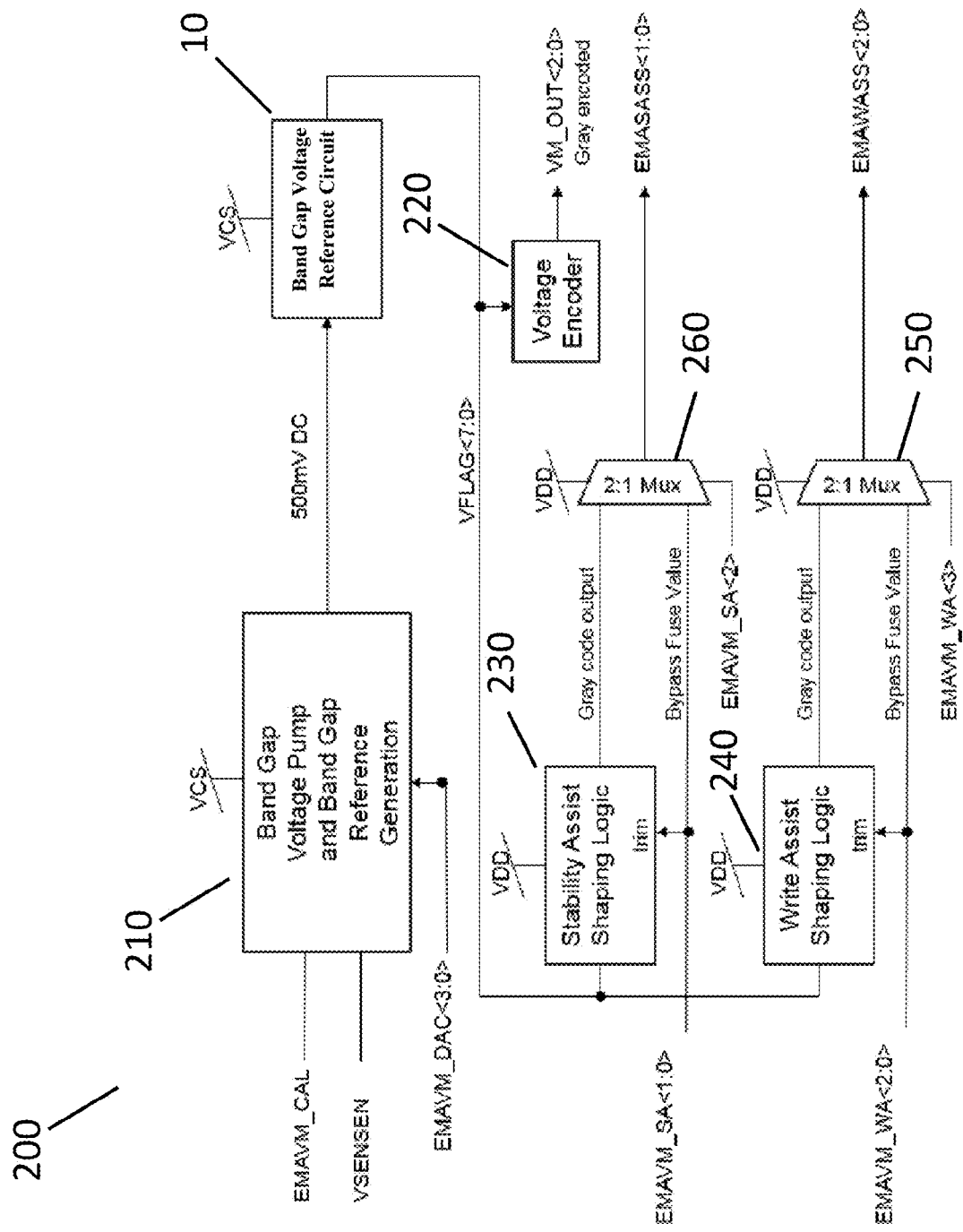
FIG. 5 shows a schematic of a voltmeter design in accordance with aspects of the disclosure.

FIG. 5 shows a schematic of a voltmeter design in accordance with aspects of the disclosure. In FIG. 5, the voltmeter design 200 includes a Band Gap Voltage Pump and Band Gap Reference Generation 210, the bandgap voltage reference circuit 10 of FIG. 1, a voltage encoder 220, a stability and assist shaping logic 230, a write assist shaping logic 240, and MUXs 250, 260. Although FIG. 5 discloses an embodiment of a voltmeter design 200, other embodiments may not use all of the circuits in FIG. 5. For example, in an alternative embodiment, the present design can eliminate the use the stability assist and shaping logic 230 and MUX 260.

In FIG. 5, the Band Gap Voltage Pump and Band Gap Reference Generation 210 takes in a power supply voltage VCS and calibration signals EMAVM_CAL, VSENSEN, and EMAVM_DAC<3:0> to produce a 500 mV bandgap reference voltage VBGR (as discussed above with reference to FIG. 1). The calibrations signals EMAVM_CAL, VSENSEN, and EMAVM_DAC<3:0> are used to reduce an error in the bandgap reference voltage VBGR. Then, the 500 mV bandgap reference voltage VBGR is input to the bandgap voltage reference circuit 10 (as discussed above with reference to FIG. 1). The 500 mV bandgap reference voltage VBGR is input to the bandgap voltage reference circuit 10, up to seven flags are output as VFLAG<7:0>. Then, the signal VFLAG<7:0> is gray code encoded as VM_OUT<2:0> through a voltage encoder 220. In other words, the voltage encoder 220 takes the VFLAG<7:0> and gray encodes the signal into VM_OUT<2:0>. The encoded signal VM_OUT<2:0> can then be routed to one or more memory compilers to broadcast an encoded version of the power supply voltage VCS.

Further, in FIG. 5, the VFLAG<7:0> is input to both the stability assist and shaping logic 230 and the write assist and shaping logic 240. The stability assist and shaping logic 230 also takes in a voltage VDD and an input signal EMAVM_SA<1:0> that can be used to trim and shape VFLAG<7:0>. The write assist and shaping logic 240 also takes in the voltage VDD and an input signal EMAVM_WA<2:0> that can be used to trim and shape VLAG<7:0>, with shaping options as shown in FIG. 4. The inputs signals EMAVM_SA<1:0> and EMAVM_WA<2:0> are signals which are input from electronic fuses or may be overridden in a test site using test pins and can also be used to provide extra margin to the stability assist of the stability assist and shaping logic 230 and extra margin to the write assist of the write assist and shaping logic 240. The stability assist and shaping logic 230 will output a gray code to a MUX 260. The write assist and shaping logic 240 will output a gray code to the MUX 250.

MUX 260 will choose between a gray code output from the stability assist and shaping logic 230 and a bypass fuse value EMAVM_SA<1:0> based on a MUX select signal EMAVM_SA<2>, and output a signal as EMASASS<1:0>. MUX 250 will choose between a gray code output from the write assist and shaping logic 240 and a bypass fuse value EMAVM_WA<2:0> based on a MUX select signal EMAVM_WA<3>, and output a signal EMAWASS<2:0>. The bypass fuse values EMAVM_SA<1:0> and EMAVM_WA<2:0> are signals which can be used to manually override the gray code outputs from the stability assist and shaping logic 230 and the write assist and shaping logic 240. EMASASS<1:0> will be used to control the amount of stability assist in the SRAM and EMAWASS<2:0> will be used to control the amount of boost in the SRAM write assist circuit 100 through signals WCAP<2:0>.

Accordingly, in view of the above, one of skill in the art would understand that the SRAM write assist circuit can be provided across process, voltage, and temperature, which is in contrast to a write assist circuit which attenuates and discards charge as the power supply voltage is increased and which makes it extremely difficult to tune the boost across process, voltage, and temperature. Moreover, in embodiments, the SRAM write assist circuit in conjunction with a bandgap voltage reference circuit provides an adaptive write assist that decreases a magnitude of boost as voltage is increased. Further, the adaptive write assist of the SRAM write assist circuit is voltage aware and is transparent to the end user/customer.

Moreover, one of skill in the art would understand that the SRAM write assist circuit, used in conjunction with the bandgap voltage reference circuit, creates an adaptive power saving SRAM write assist system which decreases an effective boost capacitance as voltage is increased in order to save power and stay under voltage reliability limits. In embodiments, the adaptive power saving SRAM write assist system requires a voltage reference which will be provided by a bandgap voltage reference circuit. In embodiments, as a voltage is increased, a required amount of boost to successfully write into an SRAM cell is reduced. Hence, in the embodiments, the adaptive power saving SRAM write assist system will change an effective amount of boost by charging and discharging capacitance. Further, the SRAM write assist system will not require discharging capacitors to ground, as has been required in other circuits in which a single boost is provided from a single capacitor. Thus, in the embodiments, power savings of the SRAM write assist system will improve the competitiveness of the write assist circuit.

Also, in order to reach 5.8 sigma writeability and also stay within voltage reliability limits, a three capacitor solution has been provided within the SRAM write circuit. In the SRAM write circuit, using the three capacitor solution, the effective capacitance will be one of 0×, 1×, 2×, 3×, 4×, 5×, 6×, and 7×. However, embodiments can use any number of weighted capacitors to integrate within the SRAM write circuit design to provide finer granularity and more power savings as voltage is increased. If more weighted capacitors are used within the SRAM write circuit, a corresponding reduction in how far a bitline is pulled below ground may be needed to successfully write the SRAM cell.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A write assist circuit, comprising:
a plurality of binary weighted boost capacitors which each contain a first node coupled to a bitline and a second node connected to a corresponding boost enabling transistor; and
a plurality of boost enabling transistors which each contain a gate connected to a boost control enable signal for controlling a corresponding binary weighted boost capacitor,
the boost control enable signal of each of the plurality of boost enabling transistors is controlled by encoded values based on a power supply level.

2. The write assist circuit of claim 1, wherein the encoded values based on the power supply level determine which of the plurality of binary weighted boost capacitors are selected and which of the plurality of binary weighted boost capacitors are not selected.

3. The write assist circuit of claim 2, wherein the binary weighted boost capacitors that are not selected are electrically isolated from the binary weighted boost capacitors that are selected in order to reduce charge sharing.

4. The write assist circuit of claim 1, wherein the encoded values based on the power supply level determine a boost level for the write assist circuit.

5. The write assist circuit of claim 1, wherein the write assist circuit is in a static random access memory (SRAM).

6. The write assist circuit of claim 1, wherein each of the plurality of binary weighted boost capacitors are NFET transistors.

7. The write assist circuit of claim 6, wherein each of the plurality of binary weighted boost capacitors are NFET transistors in which both a drain and a source are connected to the bitline.

8. The write assist circuit of claim 1, wherein each of the plurality of boost enabling transistors are NFET transistors.

9. The write assist circuit of claim 1, wherein the encoded values are output from a bandgap voltage reference circuit which takes the power supply level as an input.

10. The write assist circuit of claim 9, wherein the bandgap voltage reference circuit further comprises:
a plurality of comparators which each output a flag when the power supply level is above a predetermined comparator value;
an encoder for encoding each flag from the plurality of comparators, and outputting the encoded values.

11. A write assist circuit, comprising:
a plurality of NFET boost transistors which each contain a source and a drain coupled to a bitline and a gate connected to a corresponding boost enabling transistor; and
a plurality of boost enabling NFET transistors which each contain a gate connected to a boost control enable signal for controlling a corresponding NFET boost transistor,
the boost control enable signal of each of the plurality of boost enabling NFET transistors is controlled by encoded values based on a power supply level.

12. The write assist circuit of claim 11, wherein the encoded values based on the power supply level determine which of the plurality of NFET boost transistors are selected and which of the plurality of NFET boost transistors are not selected.

13. The write assist circuit of claim 12, wherein the NFET boost transistors that are not selected are electrically isolated from the NFET boost transistors that are selected in order to reduce charge sharing.

14. The write assist circuit of claim 11, wherein the encoded values based on the power supply level determine a boost level for the write assist circuit.

15. The write assist circuit of claim 11, wherein the write assist circuit is in a negative bitline boost system for a static random access memory (SRAM).

* * * * *